United States Patent
Nagato et al.

(10) Patent No.: US 10,222,425 B2
(45) Date of Patent: *Mar. 5, 2019

(54) BATTERY CONTROL IC AND CONTROL METHOD THEREFORE

(71) Applicant: Renesas Electronics Corporation, Tokyo (JP)

(72) Inventors: Hidekazu Nagato, Tokyo (JP); Hiromasa Takahashi, Tokyo (JP); Masaki Komatsu, Tokyo (JP); Kenta Kobayashi, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/809,443

(22) Filed: Nov. 10, 2017

(65) Prior Publication Data

US 2018/0095136 A1 Apr. 5, 2018

Related U.S. Application Data

(63) Continuation of application No. 14/065,692, filed on Oct. 29, 2013, now Pat. No. 9,846,197.

(51) Int. Cl.
  *G01R 31/36* (2006.01)
  *H01M 10/44* (2006.01)
  *B60L 11/18* (2006.01)

(52) U.S. Cl.
  CPC ................................ *G01R 31/362* (2013.01)

(58) Field of Classification Search
  CPC ... H01M 10/44; B60L 11/1861; G01R 31/362

USPC ............................................ 307/18; 320/104
See application file for complete search history.

(56) References Cited

U.S. PATENT DOCUMENTS

| | | | |
|---|---|---|---|
| 7,893,652 B2 | 2/2011 | Suzuki et al. | |
| 2008/0053715 A1 | 3/2008 | Suzuki et al. | |
| 2010/0026092 A1 | 2/2010 | Iida et al. | |

FOREIGN PATENT DOCUMENTS

| | | |
|---|---|---|
| JP | 2001051029 A | 2/2001 |
| JP | 2003079059 A | 3/2003 |
| JP | 2010034016 A | 2/2010 |

OTHER PUBLICATIONS

Communication dated May 12, 2017, from the State Intellectual Property Office of the P.R.C. in counterpart application No. 201310544603.3.
Communication dated Sep. 21, 2016 from the State Intellectual Property Office of the P.R.C. in counterpart Application No. 201310544603.3.

*Primary Examiner* — Regis Betsch
*Assistant Examiner* — Kaleria Knox
(74) *Attorney, Agent, or Firm* — Sughrue Mion, PLLC

(57) ABSTRACT

A battery control IC includes a voltage measurement unit that measures, in a normal current mode, a voltage value of each of a plurality of unit battery cells forming a battery pack, and measures, in a short-time large-current mode, a voltage value of a unit battery cell that has exhibited a lowest voltage value in the normal current mode, and a calculation unit that calculates an available power value of the battery pack in the short-time large-current mode based on a voltage value, measured in the short-time large-current mode, of the unit battery cell that has exhibited the lowest voltage value in the normal current mode.

9 Claims, 11 Drawing Sheets

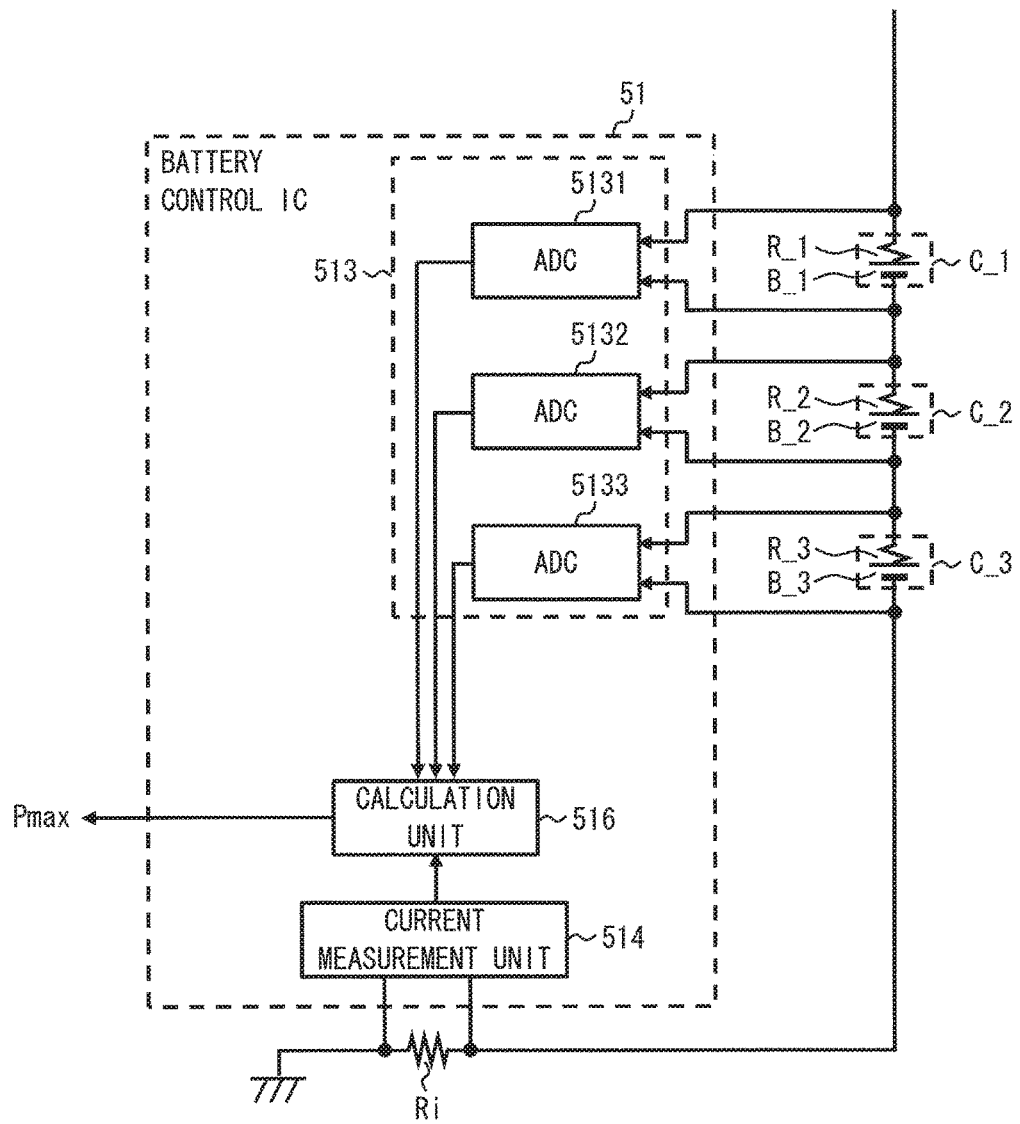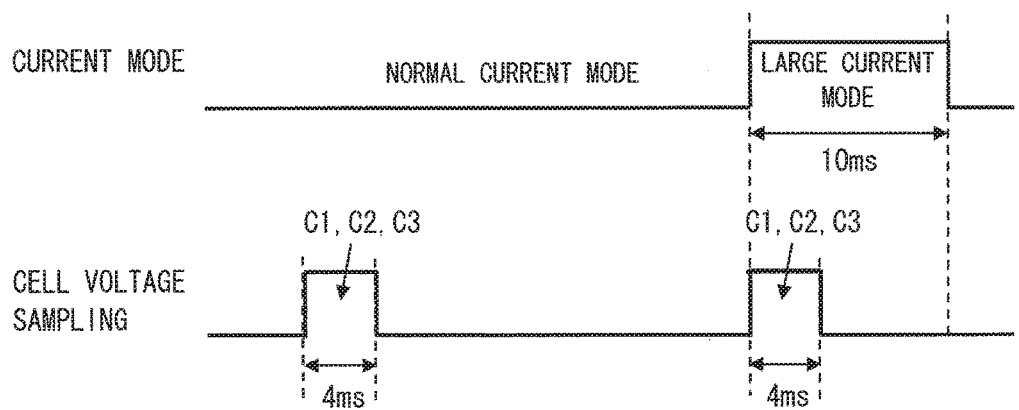
Fig. 4A

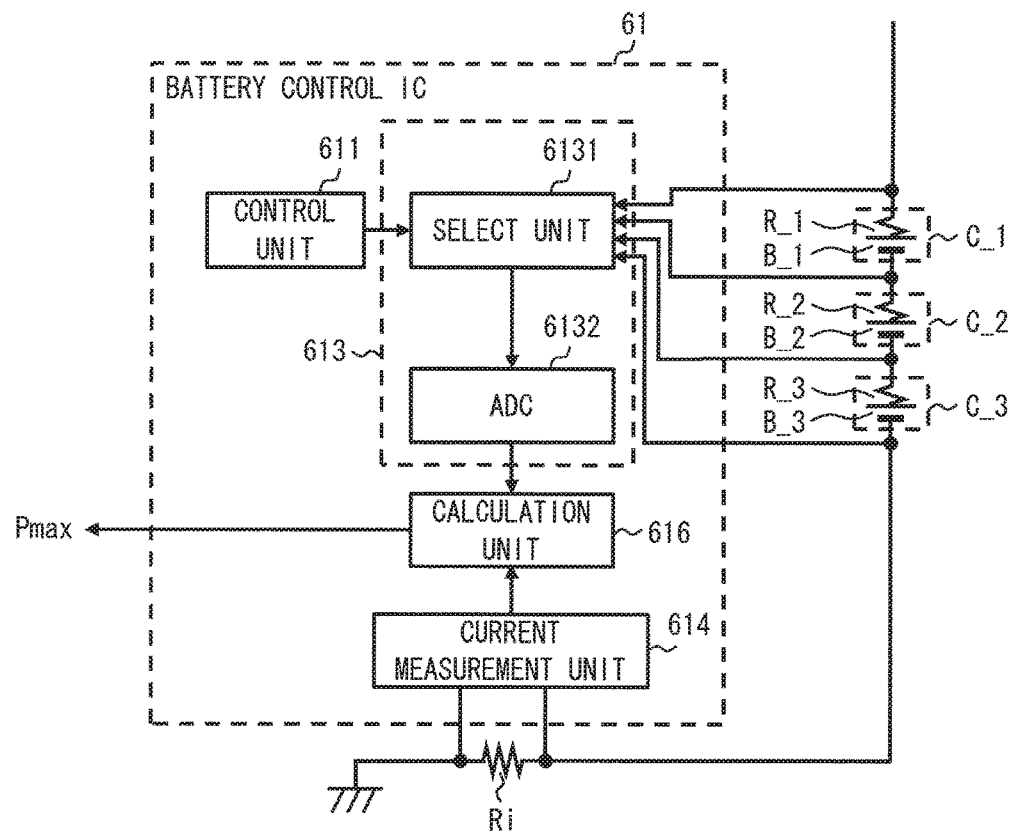
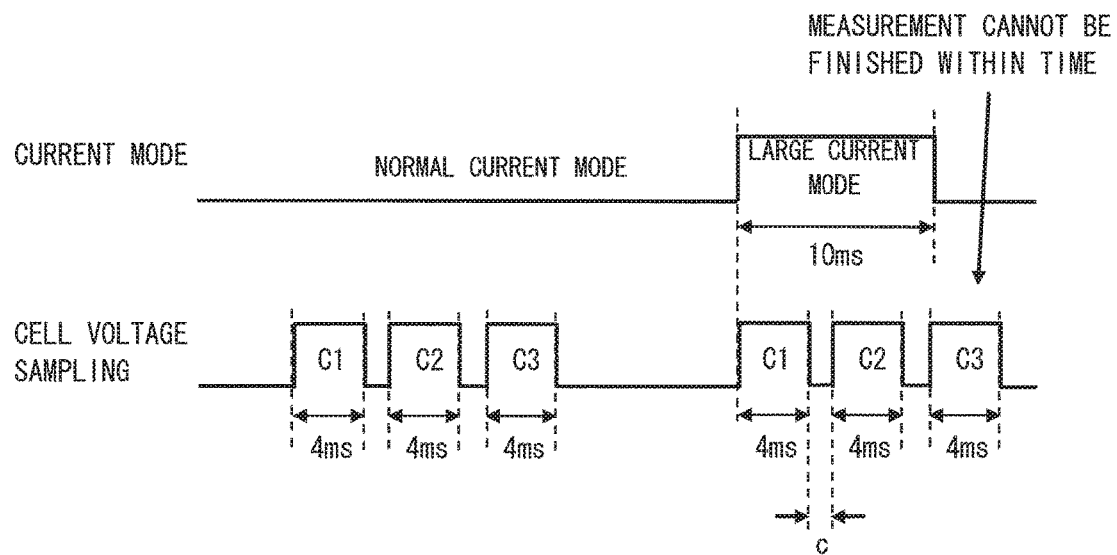
Fig. 4B

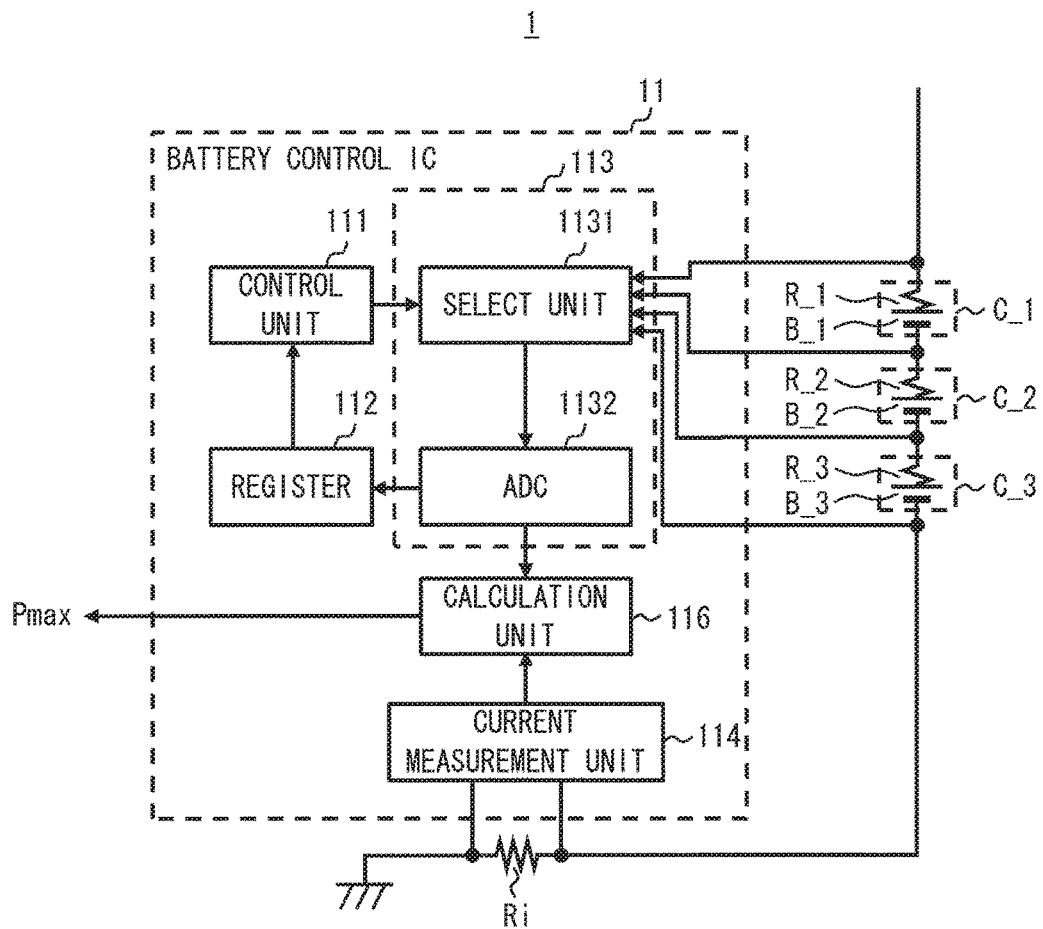
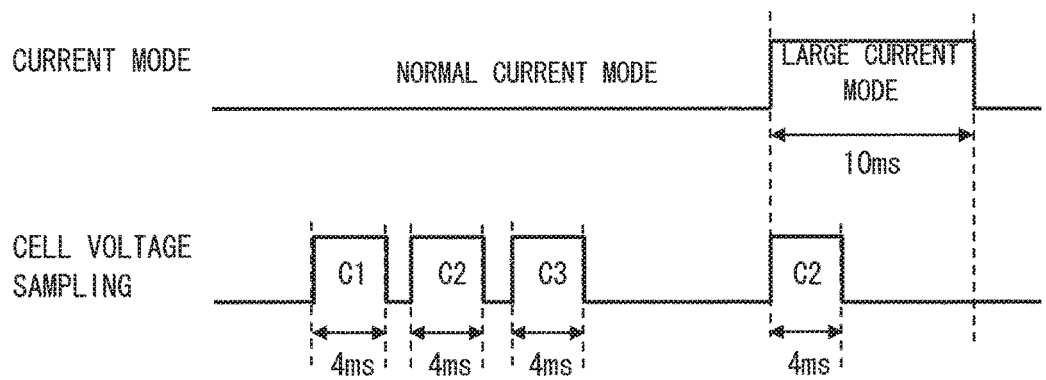
Fig. 4C

|  |  | T-rate1 | T-rate2 | T-rate3 | T-rate4 | T-rate5 |
|---|---|---|---|---|---|---|
| V-range1 | RSOC_range1 | Pmax1-1 | Pmax2-1 | Pmax3-1 | Pmax4-1 | Pmax5-1 |
|  | RSOC_range2 | Pmax1-2 | Pmax2-2 | Pmax3-2 | Pmax4-2 | Pmax5-2 |
|  | RSOC_range3 | Pmax1-3 | Pmax2-3 | Pmax3-3 | Pmax4-3 | Pmax5-3 |
|  | RSOC_range4 | Pmax1-4 | Pmax2-4 | Pmax3-4 | Pmax4-4 | Pmax5-4 |
|  | RSOC_range5 | Pmax1-5 | Pmax2-5 | Pmax3-5 | Pmax4-5 | Pmax5-5 |
|  | RSOC_range6 | Pmax1-6 | Pmax2-6 | Pmax3-6 | Pmax4-6 | Pmax5-6 |
| V-range2 | RSOC_range1 | Pmax1-7 | Pmax2-7 | Pmax3-7 | Pmax4-7 | Pmax5-7 |
|  | RSOC_range2 | Pmax1-8 | Pmax2-8 | Pmax3-8 | Pmax4-8 | Pmax5-8 |
|  | RSOC_range3 | Pmax1-9 | Pmax2-9 | Pmax3-9 | Pmax4-9 | Pmax5-9 |
|  | RSOC_range4 | Pmax1-10 | Pmax2-10 | Pmax3-10 | Pmax4-10 | Pmax5-10 |
|  | RSOC_range5 | Pmax1-11 | Pmax2-11 | Pmax3-11 | Pmax4-11 | Pmax5-11 |
|  | RSOC_range6 | Pmax1-12 | Pmax2-12 | Pmax3-12 | Pmax4-12 | Pmax5-12 |
| V-range3 | RSOC_range1 | Pmax1-13 | Pmax2-13 | Pmax3-13 | Pmax4-13 | Pmax5-13 |
|  | RSOC_range2 | Pmax1-14 | Pmax2-14 | Pmax3-14 | Pmax4-14 | Pmax5-14 |
|  | RSOC_range3 | Pmax1-15 | Pmax2-15 | Pmax3-15 | Pmax4-15 | Pmax5-15 |
|  | RSOC_range4 | Pmax1-16 | Pmax2-16 | Pmax3-16 | Pmax4-16 | Pmax5-16 |
|  | RSOC_range5 | Pmax1-17 | Pmax2-17 | Pmax3-17 | Pmax4-17 | Pmax5-17 |
|  | RSOC_range6 | Pmax1-18 | Pmax2-18 | Pmax3-18 | Pmax4-18 | Pmax5-18 |
| V-range4 | RSOC_range1 | Pmax1-19 | Pmax2-19 | Pmax3-19 | Pmax4-19 | Pmax5-19 |
|  | RSOC_range2 | Pmax1-20 | Pmax2-20 | Pmax3-20 | Pmax4-20 | Pmax5-20 |
|  | RSOC_range3 | Pmax1-21 | Pmax2-21 | Pmax3-21 | Pmax4-21 | Pmax5-21 |
|  | RSOC_range4 | Pmax1-22 | Pmax2-22 | Pmax3-22 | Pmax4-22 | Pmax5-22 |
|  | RSOC_range5 | Pmax1-23 | Pmax2-23 | Pmax3-23 | Pmax4-23 | Pmax5-23 |
|  | RSOC_range6 | Pmax1-24 | Pmax2-24 | Pmax3-24 | Pmax4-24 | Pmax5-24 |
| V-range5 | RSOC_range1 | Pmax1-25 | Pmax2-25 | Pmax3-25 | Pmax4-25 | Pmax5-25 |
|  | RSOC_range2 | Pmax1-26 | Pmax2-26 | Pmax3-26 | Pmax4-26 | Pmax5-26 |
|  | RSOC_range3 | Pmax1-27 | Pmax2-27 | Pmax3-27 | Pmax4-27 | Pmax5-27 |
|  | RSOC_range4 | Pmax1-28 | Pmax2-28 | Pmax3-28 | Pmax4-28 | Pmax5-28 |
|  | RSOC_range5 | Pmax1-29 | Pmax2-29 | Pmax3-29 | Pmax4-29 | Pmax5-29 |
|  | RSOC_range6 | Pmax1-30 | Pmax2-30 | Pmax3-30 | Pmax4-30 | Pmax5-30 |

Fig. 6A

BATTERY CONTROL IC AND CONTROL METHOD THEREFORE

CROSS-REFERENCE TO RELATED APPLICATIONS

This application is a continuation of U.S. application Ser. No. 14/065,692 filed Oct. 29, 2013, which claims priority from Japanese patent application No. 2012-245554, filed on Nov. 7, 2012, the disclosures of which are incorporated by reference herein in their entirety.

BACKGROUND

The present invention relates to a battery control IC (Integrated Circuit) and its control method.

Among the CPUs (Central Processing Units) installed in PCs (Personal Computers), there is a type of CPU that has a function of changing its operating frequency (hereinafter called "variable frequency function") in order to keep a balance among the power consumption, the calculation performance, and the reliability (life span). A CPU having the variable frequency function lowers the clock frequency in the normal operation state, and thereby prevents the increase of the power consumption, and/or maintains the CPU at a low temperature and thereby prevents the deterioration in the reliability. On the other hand, when the resource request from the application(s) increases, the CPU having the variable frequency function raises the clock frequency and thereby increases the calculation performance. However, if the clock frequency is kept at a high frequency for a long time, the power consumption and the temperature of the CPU increase and thus the reliability deteriorates. Therefore, the period during which the clock frequency is kept at a high frequency is limited to a short period such as 10 ms.

Note that when a CPU having a variable frequency function is driven by electric power supplied from a battery pack (battery) in which a plurality of secondary battery cells are combined, the clock frequency in the high-speed operation state is determined based on the amount of the available power of that battery pack. (More specifically, how much the clock frequency in the high-speed operation state should be increased from that in the normal operation state is determined based on the amount of the available power.) Note that it has been required that a battery control semiconductor integrated circuit device (hereinafter referred to as "battery control IC") that calculates the available power value of a battery pack should calculate the available power value of the battery pack immediately within the short period in which the high-speed operation is performed.

Incidentally, Japanese Unexamined Patent Application Publication No. 2010-34016 discloses an evaluation apparatus that measures a detection current value of a discharge overcurrent with high accuracy. Further, Japanese Unexamined Patent Application Publication No. 2003-79059 discloses a vehicle-mounted battery pack control apparatus that prevents over-charging/over-discharging and is capable of widening the available capacity range of the battery with a simple configuration and thereby reducing the size and weight of the apparatus. Further, Japanese Unexamined Patent Application Publication No. 2001-51029 discloses a rechargeable battery including an internal circuit, capable of externally outputting the remaining capacity of the battery according to the usage state of the battery and capable of improving the usage efficiency of the rechargeable battery.

SUMMARY

The present inventors have found the following problem. As described above, the battery control IC (battery control semiconductor integrated circuit device) has been required to calculate the available power value of the battery pack immediately within the short period in which the high-speed operation of the CPU or the system equipped therewith is performed. The other problems to be solved and the novel features will become apparent from the following description of this specification and the accompanying drawings.

A first aspect of the present invention is a battery control IC including a calculation unit that calculates an available power value of a battery pack in a short-time large-current mode based on a voltage value, measured in the short-time large-current mode, of a unit battery cell that has exhibited a lowest voltage value in a normal current mode among a plurality of unit battery cells forming the battery pack.

Further, another aspect of the present invention is a control method for a battery control IC, including calculating an available power value of a battery pack in a short-time large-current mode based on a voltage value, measured in the short-time large-current mode, of a unit battery cell that has exhibited a lowest voltage value in a normal current mode among a plurality of unit battery cells forming the battery pack.

Further, another aspect of the present invention is a control method for a battery control IC, including calculating an available power value of a battery pack based on a difference between a voltage value of a unit battery cell measured in a measurement period including a short-time large-current mode period and a voltage value of the unit battery cell measured in a measurement period including no short-time large-current mode period.

According to the aspect, it is possible to provide a battery control IC capable of immediately calculating the available power value of a battery pack in a short-time large-current mode.

BRIEF DESCRIPTION OF THE DRAWINGS

The above and other aspects, advantages and features will be more apparent from the following description of certain embodiments taken in conjunction with the accompanying drawings, in which:

FIG. 4A is a diagram for explaining a battery control IC according to a first comparative example;

FIG. 4B is a diagram for explaining a battery control IC according to a second comparative example;

FIG. 4C is a diagram for explaining a battery control IC according to a first embodiment;

FIG. 6A is a conceptual initial-value table that is referred to by a battery control IC according to a second embodiment;

DETAILED DESCRIPTION

Embodiments are explained hereinafter with reference to the drawings. It should be noted that the drawings are made in a simplified manner, and therefore the technical scope of the embodiments should not be narrowly interpreted based on those drawings. Further, the same components are assigned with the same symbols and their duplicated explanation is omitted.

In the following embodiments, when necessary, the present invention is explained by using separate sections or separate embodiments. However, those embodiments are not unrelated with each other, unless otherwise specified. That is, they are related in such a manner that one embodiment is a modified example, an application example, a detailed example, or a supplementary example of a part or the whole of another embodiment. Further, in the following embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may be also used.

Further, in the following embodiments, their components (including operation steps and the like) are not necessarily indispensable except for cases where the component is explicitly specified or the component is obviously indispensable based on its principle. Similarly, in the following embodiments, when a shape, a position relation, or the like of a component(s) or the like is mentioned, shapes or the likes that are substantially similar to or resemble that shape are also included in that shape except for cases where it is explicitly specified or they are eliminated based on its principle. This is also true for the above-described number or the like (including numbers, values, quantities, ranges, and the like).

First Embodiment

Figure 1:
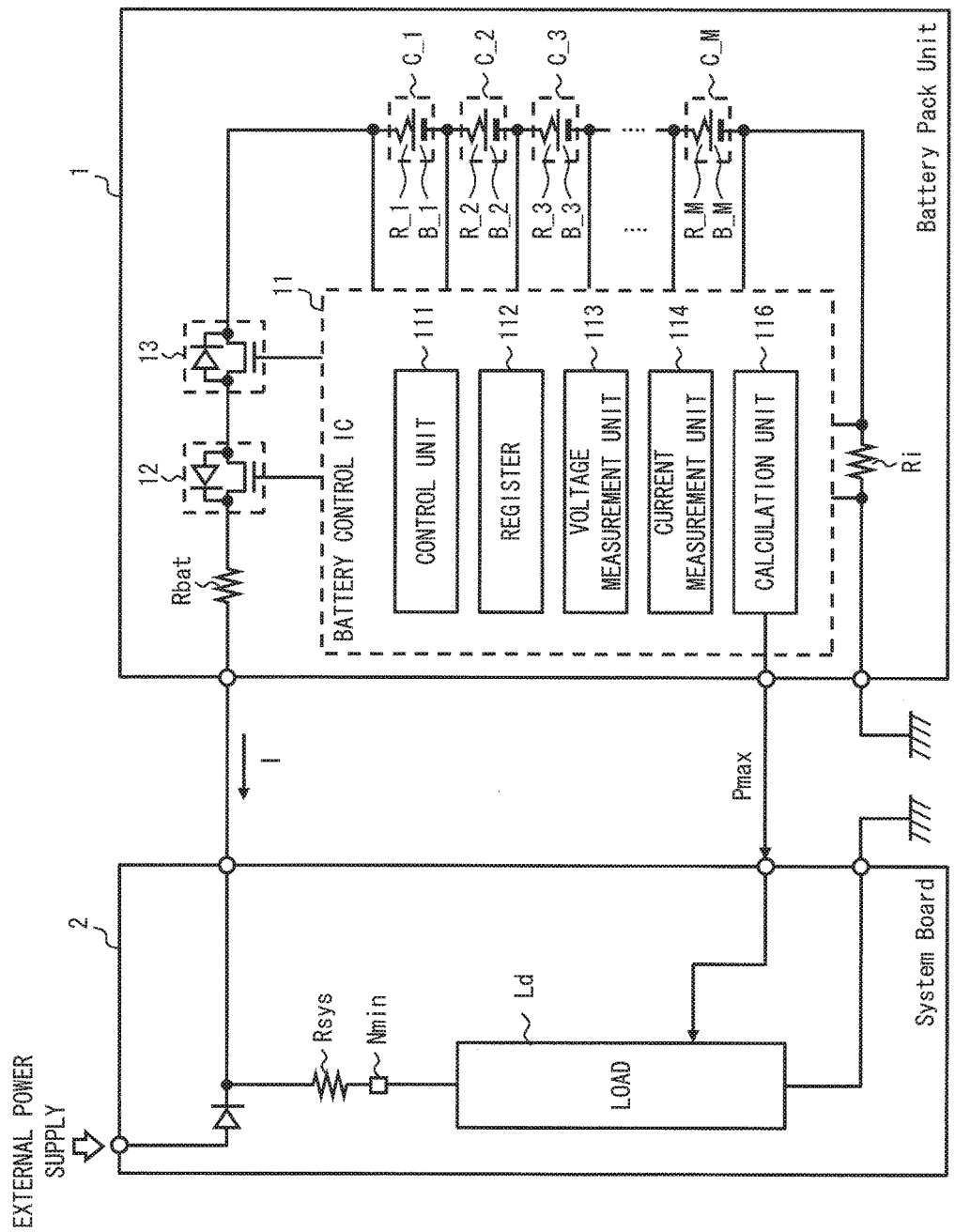
FIG. 1 is a block diagram showing a configuration example of a computer system equipped with a battery control IC according to a first embodiment.

FIG. 1 is a block diagram showing a computer system equipped with a battery control semiconductor integrated circuit device (hereinafter referred to as "battery control IC") according to a first embodiment. The battery control IC is formed, though not limited to, on a semiconductor substrate made of one single-crystal silicon such as silicon by using a publicly-known CMOS manufacturing process. The battery control IC according to this embodiment calculates an available power value Pmax of a battery pack in a short-time large-current mode based on a voltage value, measured in the short-time large-current mode, of a secondary battery cell that has exhibited the lowest voltage value in a normal current mode among a plurality of secondary battery cells constituting the battery pack. As a result, the battery control IC according to this embodiment can immediately calculate the available power value of the battery pack in the short-time large-current mode without increasing the circuit size. The embodiment is explained hereinafter in detail.

The computer system shown in FIG. 1 includes a battery pack unit 1 and a system board 2.

The system board 2 includes a load Ld to which electric power is supplied from the battery pack unit 1, and a parasitic resistance Rsys to the load Ld. Further, the system board 2 includes an external power supply connection terminal to which an external power supply is connected as required and through which electric power is thereby supplied. Note that a voltage at a node Nmin present in the high-potential-side power supply terminal of the load Ld defines the minimum voltage Vmin that ensures the operation of the load Ld. The system board 2 operates properly under the condition that the voltage of the node Nmin is equal to or greater than the minimum voltage Vmin. Therefore, the system board 2 requests the external power supply and the battery pack unit 1 to meets this condition. Alternatively, the system board 2 controls the operation of the load Ld itself according to the information provided from the battery pack unit 1 so that this condition is met.

The external power supply is, for example, an AC adaptor or the like. Further, the load Ld includes at least one semiconductor component. For example, the load Ld includes an MPU (Micro Processing Unit), a RAM (Random Access Memory), an SSD (Solid State Disk), or the like.

The load Ld lowers the clock frequency in the normal operation mode, and thereby prevents the increase of the power consumption, and/or maintains the load Ld at a low temperature and thereby prevents the deterioration in the reliability. On the other hand, when the resource request from the application(s) increases, the load Ld raises the clock frequency and thereby increases the calculation performance. However, if the clock frequency is kept at a high frequency for a long time, the power consumption and the temperature increase and thus the reliability deteriorates. Therefore, the period during which the clock frequency is kept at a high frequency is limited to a short period such as 10 ms.

In the following explanation, it is assumed that the power consumption of the load Ld is fundamentally determined according to the clock frequency and the power consumption does not fluctuate widely according to the type of the processing performed by the load Ld. Therefore, it is assumed that the power consumption of the load Ld is low in the normal operation mode in which the clock frequency is low and the power consumption of the load Ld is high in the high-speed operation mode in which the clock frequency is high. As mentioned previously, the load Ld whose main component (s) consuming electric power is a semiconductor component(s), in particular, a CMOS semiconductor component(s) meets this condition. Note that the normal operation mode of the load Ld may be also referred to as "normal current mode" because the discharge current from the battery pack is small. Further, the high-speed operation mode of the load Ld may be also referred to as "short-time large-current mode" because the discharge current from the battery pack is large and its duration is short.

The system board 2 operates by using the battery pack disposed in the battery pack unit 1 as its power supply (or part of its power supply). In other words, the system board 2 operates because the discharge current from the battery pack is supplied. In addition, when an external power supply such as an AC adaptor is connected to the external power supply connection terminal, the system board 2 charges the battery pack by supplying a charge current from the external power supply to the battery pack.

The battery pack unit 1 includes M secondary battery cells (unit battery cells) C_1 to C_M (M is an integer no less than two) that constitute the battery pack, a charge control circuit 12, a discharge control circuit 13, a current measurement resistive element Ri, a battery control IC 11 connected to these components, and a parasitic resistance Rbat on the current path of the battery pack.

The charge control circuit 12 includes, for example, a diode and a MOS transistor that are arranged in parallel on the current path of the battery pack. The discharge control circuit 13 includes, for example, a diode and a MOS transistor that are arranged in parallel on the current path of the battery pack.

For example, when the battery pack is charged, the MOS transistor of the charge control circuit 12 is turned on and the MOS transistor of the discharge control circuit 13 is turned off according to a control signal(s) output from the battery control IC 11. As a result, the charge current is supplied from the system board 2 to the battery pack through the MOS transistor of the charge control circuit 12 and the diode of the discharge control circuit 13. On the other hand, when the battery pack is discharged, the MOS transistor of the charge control circuit 12 is turned off and the MOS transistor of the discharge control circuit 13 is turned on according to the control signal(s) output from the battery control IC 11. As a result, the discharge current from the battery pack is supplied to the load Ld in the system board 2 through the MOS transistor of the discharge control circuit 13 and the diode of the charge control circuit 12. Note that the parasitic resistance Rbat includes the on-resistances of the MOS transistors in both the charge control circuit 12 and the discharge control circuit 13.

The secondary battery cells $C\_1$ to $C\_M$ constituting the battery pack include secondary batteries $B\_1$ to $B\_M$ and parasitic resistances $R\_1$ to $R\_M$ that are connected in series with the respective secondary batteries $B\_1$ to $B\_M$. The current measurement resistive element Ri is disposed in series on the current path of the battery pack.

The battery control IC 11 includes a register (storage unit) 112, a voltage measurement unit 113, a current measurement unit 114, a calculation unit 116, and a control unit 111.

The register 112 stores various parameters. The voltage measurement unit 113 measures a voltage of each of the secondary battery cells $C\_1$ to $C\_M$ constituting the battery pack. Specifically, the voltage measurement unit 113 measures a potential difference across each of the secondary battery cells $C\_1$ to $C\_M$ constituting the battery pack. The current measurement unit 114 measures a current flowing through the current path of the battery pack. Specifically, the current measurement unit 114 measures a potential difference across the resistive element Ri, which is disposed in series on the current path of the battery pack, and thereby measures the current flowing through the current path.

The calculation unit 116 outputs the available power value Pmax of the battery pack based on the respective measurements results of the voltage measurement unit 113 and the current measurement unit 114. Note that the available power value Pmax is an electric power value corresponding to a difference (available amount) between the electric power that the battery pack can output in the short-time large-current mode and the electric power that the battery pack outputs in the normal current mode. The information of this available power value Pmax is supplied to the system board 2.

The control unit 111 controls the operations of these components, controls the switching between the charging and discharging of the battery pack, and controls the amount of the charging/discharging so that the battery pack operates properly.

[Operation of Battery Control IC 11]

Figure 2:
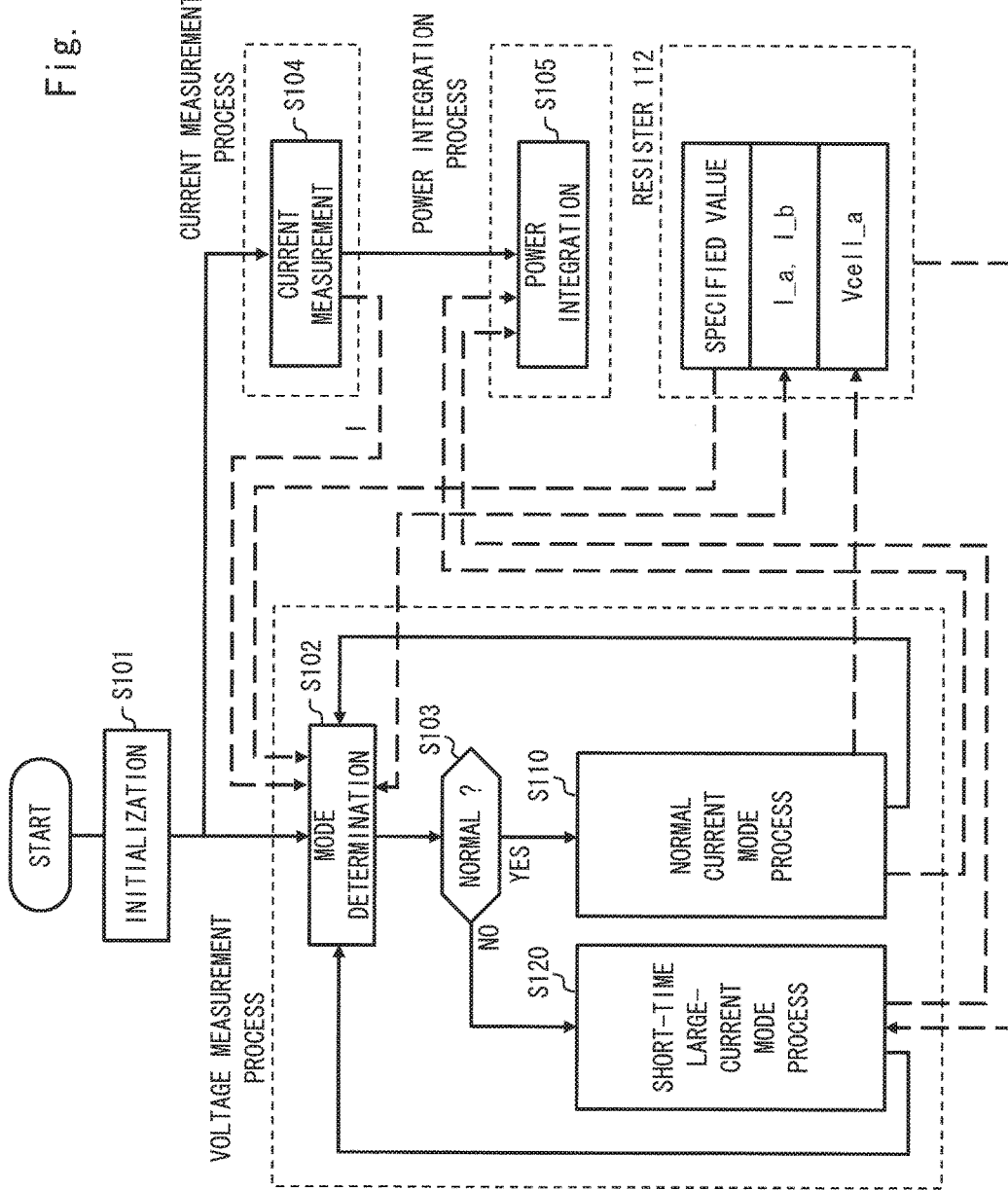
FIG. 2 is a flowchart showing an operation of a battery control IC according to a first embodiment.

Next, an operation of the battery control IC 11 is explained in detail with reference to FIG. 2. FIG. 2 is a flowchart showing an operation of the battery control IC 11. Note that solid lines represent process flows and broken lines represent data flows.

As shown in FIG. 2, firstly, the battery control IC 11 is initialized (step S101). In the initialization, a specified value (threshold) that is used as the criterion of the mode determination, for example, is set. Details of the initialization are described later.

Note that the register 112 is used as a data storage place of various parameters and the like. For example, the register 112 stores the specified value (threshold) used as the mode determination criterion, a current value $I\_a$ measured in the normal current mode, a current value $I\_b$ measured in the short-time large-current mode, voltage values $Vcell\_a\_1$ to $Vcell\_a\_M$ of the respective secondary battery cells $C\_1$ to $C\_M$ measured in the normal current mode (hereinafter, these voltages may be collectively referred to as "$Vcell\_a$"), and so on. Note that the information of the specified value used as the mode determination criterion is supplied from the system board 2 in the initialization process (step S101). Details of the various parameters including these parameters are also described later.

Next, the whole process is divided into and processed as a voltage measurement process, a current measurement process, and a power integration process. The voltage measurement process and the current measurement process are performed in parallel. Then, in the power integration process, the cumulative power amount (i.e., the remaining battery amount) of the secondary battery cells $C\_1$ to $C\_M$ is calculated based on the respective processing results of the voltage measurement process and the current measurement process.

Firstly, the current measurement process is explained. In the current measurement process, the current measurement unit 114 measures the potential difference across the resistive element Ri and thereby measures the current value I flowing through the current path of the battery pack (step S104).

Next, the voltage measurement process is explained. The voltage measurement process includes a mode determination process (step S102), a process select process (step S103), a normal current mode process (step S110), and a short-time large-current mode process (step S120).

In the voltage measurement process, firstly, the mode determination process is performed (step S102). In the mode determination process, for example, the control unit 111 determines the mode based on the current value I measured by the current measurement unit 114. Specifically, the control unit 111 determines that the computer system is in the normal current mode when the current value I is equal to or less than the specified value, and determines that the computer system is in the short-time large-current mode when the current value I is greater than the specified value. Note that when the computer system is determined to be in the normal current mode, the current value I is stored into the register 112 as the current value $I\_a$, whereas when the computer system is determined to be in the short-time large-current mode, the current value I is stored into the register 112 as the current value $I\_b$.

After that, the process is selected based on the mode determination result (step S103). Specifically, when the computer system is determined to be in the normal current mode (Yes at step S103), the process changes to the normal current mode process (step S110), whereas when the computer system is determined to be in the short-time large-current mode (No at step S103), the process changes to the short-time large-current mode process (step S120). Note that in either the normal current mode process (step S110) or the short-time large-current mode process (step S120), upon the completion of that process, the process returns to the mode determination process (step S102).

Next, the power integration process is explained. In the power integration process, as one of the basic functions of the battery control IC, the battery control IC calculates the cumulative power amount, i.e., the remaining battery amount. The battery control IC calculates a power consumption value from the product of the voltage of the battery pack that is measured and calculated in the normal current mode process (step S110) or the short-time large-current mode process (step S120) and the current value measured in the current measurement process (step S104) at that point. This power consumption value is obtained at regular intervals to calculate the power amount. Then, the remaining battery amount of the battery pack is obtained by subtracting the obtained power amount from the remaining power amount of the whole battery pack. In this flow, the discharging mode of the battery pack has been explained. In the case of the charging mode of the battery pack, the remaining battery amount of the battery pack is calculated by adding the charging power amount to the remaining power amount.

[More Detailed Operation of Battery Control IC 11]

Figure 3:
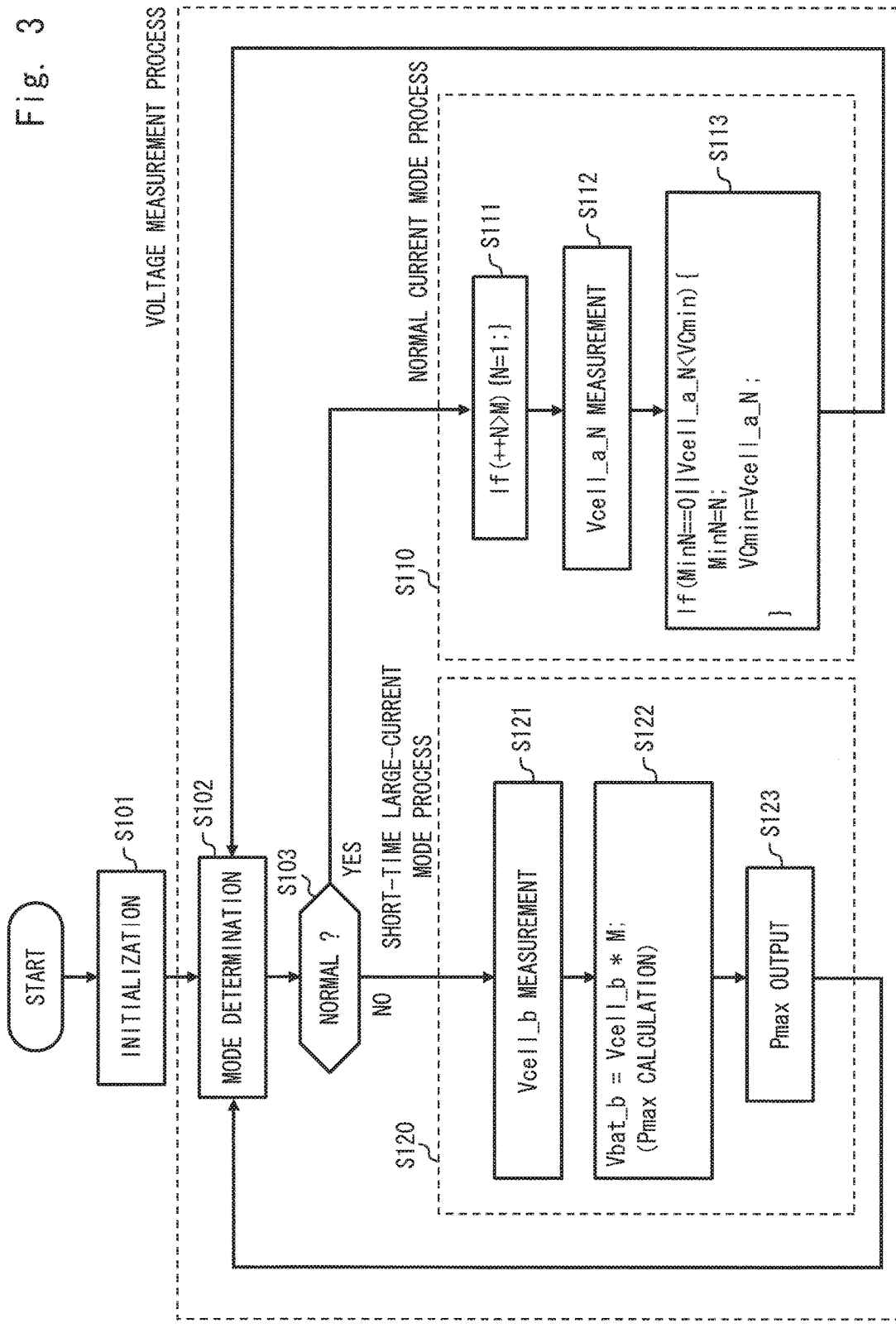
FIG. 3 is a flowchart showing a calculation operation of an available power value Pmax of a battery control IC according to a first embodiment.

Next, a more detailed operation of the battery control IC 11 is explained with reference to FIG. 3. FIG. 3 is a flowchart showing a calculation operation of the available power value Pmax of the battery control IC 11.

As shown in FIG. 3, firstly, the battery control IC 11 is initialized (step S101). Specifically, in the initialization, a parasitic resistance value of each secondary battery cell in the normal current mode, a resistance value of the current measurement resistive element Ri, a resistance value of the parasitic resistance Rbat, an on-resistance of the MOS transistor and a forward drop voltage VF of the diode of each of the charge control circuit 12 and the discharge control circuit 13, a resistance value of the parasitic resistance Rsys of the system board 2, the minimum voltage Vmin at the node Nmin, and a specified value (threshold) used as the mode determination criterion are set. These parameters are supplied from the system board 2 as external parameters and stored into the register 112.

Further, in the initialization, variables N and MinN, which are internal parameters, are set to an initial value "0". Further, in the initialization, VCmin, M, Vcell_a_1 to Vcell_a_M, Vcell_b, and Vbat_b, which are internal parameters, are also set. These internal parameters are stored in the register 112 together with the above-described external parameters.

Note that the variable M indicates the number of secondary battery cells. The variable N is 0 in the initial state and becomes an integer between 1 to M after the operation starts. The variables Vcell_a_1 to Vcell_a_M indicate the voltage values of the respective secondary battery cells C_1 to C_M measured in the normal current mode. The variable VCmin indicates the lowest voltage value among the voltage values of the respective secondary battery cells C_1 to C_M measured in the normal current mode. The variable MinN indicates information (N value) of the secondary battery cell C_MinN that has exhibited the lowest voltage value in the normal current mode. The value MinN takes an integer between 1 to M. The value Vcell_b indicates the voltage value of the secondary battery cell C_MinN measured in the short-time large-current mode. The value Vbat_b indicates the lowest voltage value of the battery pack in the short-time large-current mode.

Next, the whole process is divided into and processed as a voltage measurement process, a current measurement process, and a power integration process. The current measurement process and the power integration process are the same as those explained above with reference to FIG. 2, and therefore their illustration in the drawings and explanation are omitted.

The voltage measurement process is explained hereinafter. The voltage measurement process includes a mode determination process (step S102), a process select process (step S103), a normal current mode process (step S110), and a short-time large-current mode process (step S120). The mode determination process (step S102) and the process select process (step S103) are the same as those explained above with reference to FIG. 2. Therefore, the normal current mode process (step S110) and the short-time large-current mode process (step S120) are mainly explained hereinafter.

Firstly, the normal current mode process (step S110) is explained.

In the normal current mode process, firstly, the variable N is incremented by one from the initial value "0" (++N or N=N+1) (step S111). Note that when the increment is repeated and the variable N exceeds the number M of secondary battery cells, the variable N is set to "1" again (step S111). Therefore, the variable N is "0" in the initial state and successively becomes integers 1 to M after the operation starts.

Next, the voltage measurement unit 113 measures the voltage value Vcell_a_N of the secondary battery cell C_N (step S112). Note that as described above, the variable N successively becomes integers 1 to M. Therefore, the voltage measurement unit 113 successively measures the voltage values Vcell_a_1 to Vcell_a_M of the respective secondary battery cells C_1 to C_M.

Next, the substitution process into the variables MinN and VCmin is performed (step S113).

For example, when the variable MinN is the initial value "0", the variable N itself at the time of the voltage measurement (typically, value "1") is substituted into the variable MinN. At the same time, the voltage value Vcell_a_N itself measured at that time is substituted into the variable VCmin.

Further, when the measured voltage value Vcell_a_N is smaller than the variable VCmin, that voltage value Vcell_a_N is substituted into the variable VCmin. At the same time, the variable N at the time of this voltage measurement is substituted into the variable MinN. Since above-described process is repeated, the lowest voltage value among the voltage values of the respective secondary battery cells C_1 to C_M is substituted into the variable VCmin. Further, the information (N value) of the secondary battery cell indicating that lowest voltage value is substituted into the variable MinM.

Next, the short-time large-current mode process (step S120) is explained.

In the short-time large-current mode process, firstly, the voltage measurement unit 113 measures the voltage value Vcell_b of the secondary battery cell C_MinN, which has indicated the lowest voltage value in the normal current mode, in the short-time large-current mode (step S121).

Next, the calculation process of the available power value Pmax is performed (step S122).

Firstly, the calculation unit 116 multiplies the voltage value Vcell_b by the number M of secondary battery cells and substitutes the resultant value into the variable Vbat_b (Vbat_b=Vcell_b×M). Therefore, it can be said that the variable Vbat_b indicates the lowest voltage of the battery pack in the short-time large-current mode.

Next, the calculation unit 116 calculates the change of the total parasitic resistance of the battery pack, which has been caused by the switching from the normal current mode to the short-time large-current mode, based on Expression (1) shown below.

$$R\text{cell} = |(V\text{bat\_b} - V\text{Cmin} \times M)|/|(I\_b - I\_a)| \qquad (1)$$

Next, the calculation unit 116 calculates the available power value Pmax of the battery pack in the short-time large-current mode based on Expression (2) shown below.

$$P\text{max} = (V\text{Cmin} \times M - I\_a \times R\text{cell} - VF - V\text{min})/(R\text{cell} + R\text{bat} + Ri + R\text{sys}) \times V\text{min} \qquad (2)$$

Note that the value VF indicates the forward drop voltage of the diode in the charge control circuit 12, which operates when the battery pack is discharged.

After that, this available power value Pmax is supplied to the system board 2 (step S123). The system board 2 determines the clock frequency in the high-speed operation state, based on this available power value Pmax.

As described above, the battery control IC according to this embodiment calculates the available power value Pmax of the battery pack in the short-time large-current mode based on the voltage value, measured in the short-time large-current mode, of the secondary battery cell that has exhibited the lowest voltage value in the normal current mode among a plurality of secondary battery cells constituting the battery pack. As a result, the battery control IC according to this embodiment can immediately calculate the available power value of the battery pack in the short-time large-current mode without increasing the circuit size.

The battery control IC 11 according to this embodiment outputs, for example, information of the available power value Pmax of the battery pack in the short-time large-current mode to the system board 2 at any time (e.g., once a second).

Note that as described above, the total parasitic resistance (impedance) of the battery pack usually changes according to the value of the discharge current of the battery pack (i.e., according to the current mode). Therefore, needless to say, it is desirable that the available power value Pmax of the battery pack in the short-time large-current mode is calculated according to the difference Rcell of the total parasitic resistance that is calculated based on the voltage values of the secondary battery cells measured in the short-time large-current mode. However, there is not enough time to measure the voltage values of all the secondary battery cells after the computer system changes to the short-time large-current mode. Further, it is undesirable to enter the short-time large-current mode on purpose just to calculate the available power value Pmax, because it increases the power consumption. Therefore, it is required that when the computer system changes to the short-time large-current mode, the battery control IC should effectively calculate the available power value Pmax of the battery pack by making full use of the voltage value of each secondary battery cell measured in the normal current mode. The battery control IC 11 according to this embodiment satisfies this requirement.

[Explanation of Advantageous Effect of Battery Control IC 11]

Advantageous effects of the battery control IC according to this embodiment are explained hereinafter with reference to FIGS. 4A to 4C in a more detailed manner. FIG. 4A is a diagram showing a part of a configuration of a battery control IC 51 and its timing chart according to a first comparative example. FIG. 4B is a diagram showing a part of a configuration of a battery control IC 61 and its timing chart according to a second comparative example. FIG. 4C is a diagram showing a part of a configuration of the battery control IC 11 and its timing chart according to this embodiment.

The following explanation is made by using an example in which the battery pack is composed of three secondary battery cells C_1 to C_3. Further, the following explanation is made by using an example in which the duration of the short-time large-current mode (large current mode) is 10 ms and the voltage measurement time of a secondary battery cell is 4 ms.

[Battery Control IC 51 According to First Comparative Example]

Firstly, a battery control IC 51 according to a first comparative example is explained with reference to FIG. 4A.

The battery control IC 51 shown in FIG. 4A includes at least a voltage measurement unit 513, a current measurement unit 514, and a calculation unit 516. Note that the voltage measurement unit 513, the current measurement unit 514, and the calculation unit 516 correspond to the voltage measurement unit 113, the current measurement unit 114, and the calculation unit 116 respectively.

Note that the voltage measurement unit 513 includes three AD converters 5131 to 5133 that measure the voltage values of the three secondary battery cells C_1 to C_3 respectively. The voltage measurement unit 513 simultaneously measures the voltage values of the respective secondary battery cells C_1 to C_3. Therefore, even when the battery control IC 51 starts the measurement after changing to the short-time large-current mode, the battery control IC 51 can complete the measurement of the voltage values of the respective secondary battery cells C_1 to C_3. That is, the battery control IC 51 can immediately calculate the available power value Pmax of the battery pack in the short-time large-current mode.

However, there is a problem that since the battery control IC 51 needs to include the same number of AD converters as the number of the secondary battery cells, the battery control IC 51 cannot prevent the increase of the circuit size.

[Battery Control IC 61 According to Second Comparative Example]

Next, a battery control IC 61 according to a second comparative example is explained with reference to FIG. 4B.

The battery control IC 61 shown in FIG. 4B includes at least a voltage measurement unit 613, a current measurement unit 614, and a calculation unit 616 Note that the voltage measurement unit 613, the current measurement unit 614, and the calculation unit 616 correspond to the voltage measurement unit 113, the current measurement unit 114, and the calculation unit 116 respectively.

Note that the voltage measurement unit 613 includes a select unit 6131 and one AD converter 6132. Further, the select unit 6131 may be provided separately from the voltage measurement unit 613. The control unit 611 successively selects one of the three secondary battery cells C_1 to C_3 by using the select unit 6131. The AD converter 6132 successively measures the voltage value of the secondary battery cell selected by the select unit 6131. As a result, the battery control IC 61 can measure the voltage values of a plurality of secondary battery cells by using one AD converter irrespective of the number of secondary battery cells. That is, the battery control IC 61 can measure the voltage values of a plurality of secondary battery cells without increasing the circuit size.

However, the battery control IC 61 measures the voltage values of the respective secondary battery cells C_1 to C_3 one by one. Therefore, assuming that the measurement of one secondary battery cell takes, for example, 4 ms, even if the battery control IC 61 attempts to measure the voltage values of all the secondary battery cells C_1 to C_3 within the duration of the short-time large-current mode (e.g., within 10 ms), the measurement of all the voltage values takes a time longer than that duration, i.e., a time expressed as "(4 ms+c)×3>10 ms". That is, the battery control IC 61 cannot complete the measurement of the voltage values of all the secondary battery cells C_1 to C_3 within the duration of the short-time large-current mode. Note that the time c is a time necessary for the preparation between one voltage measurement operation and the next voltage measurement operation. That is, there is a problem that the battery control IC 61 cannot immediately calculate the available power value Pmax of the battery pack in the short-time large-current mode.

[Battery Control IC 11 According to this Embodiment]

Next, a battery control IC 11 according to this embodiment is explained with reference to FIG. 4C.

The battery control IC 11 shown in FIG. 4C has a similar configuration to that shown in FIG. 1. However, the battery control IC 11 shown in FIG. 4C includes a select unit 1131 and an AD converter 1132 as the voltage measurement unit 113. Note that the select unit 1131 may be provided separately from the voltage measurement unit 113. Further, the number of AD converters should be smaller than the number of secondary battery cells.

Note that in the short-time large-current mode, the voltage measurement unit 113 measures the voltage value of only the secondary battery cell that has exhibited the lowest voltage value in the normal current mode. Therefore, the battery control IC 11 can immediately calculate the available power value Pmax of the battery pack in the short-time large-current mode without increasing the circuit size (by using fewer AD converters).

Second Embodiment

Figure 5:
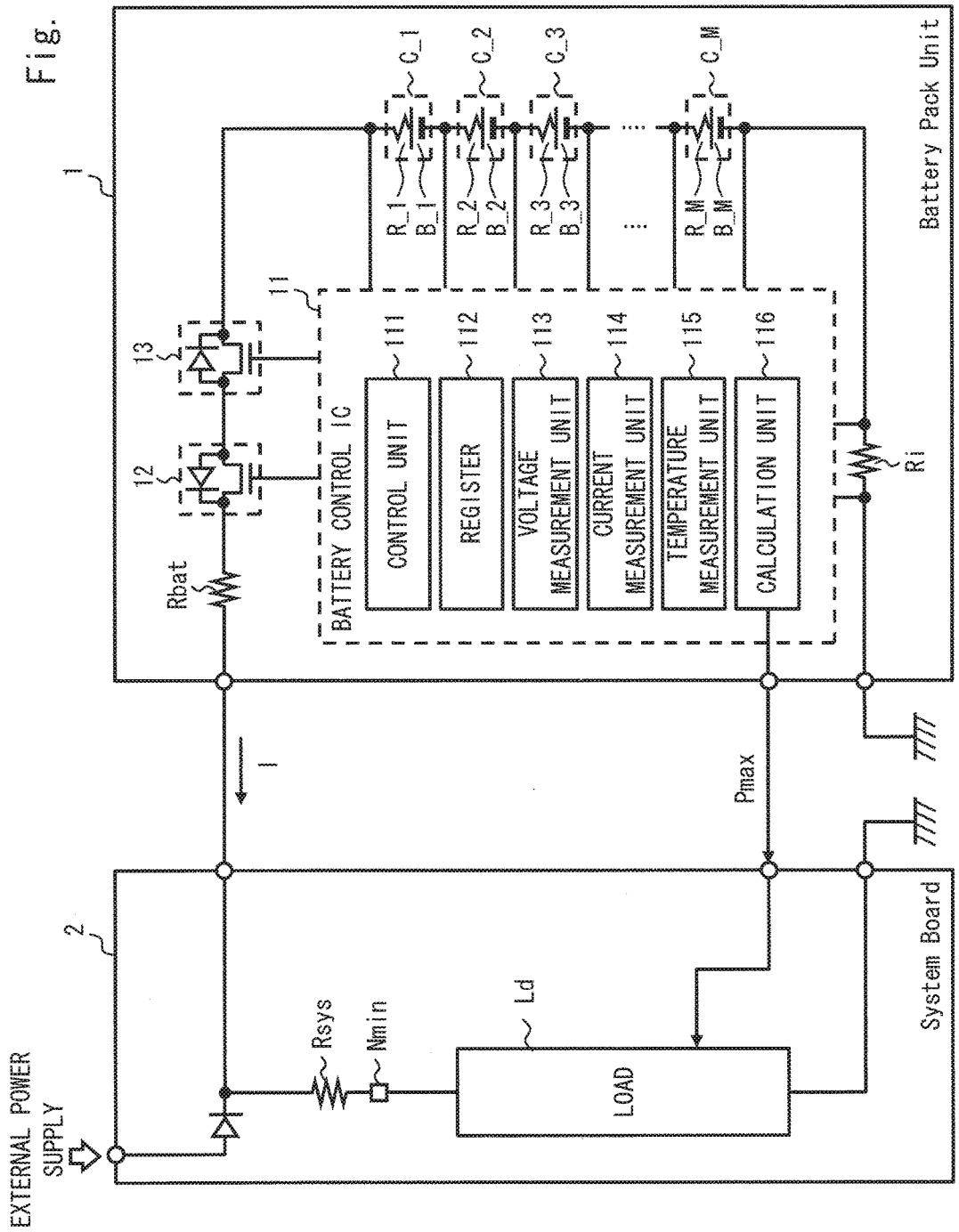
FIG. 5 is a block diagram showing a configuration example of a computer system equipped with a battery control IC according to a second embodiment.

FIG. 5 is a block diagram showing a computer system equipped with a battery control IC according to a second embodiment. When compared with the battery control IC 11 shown in FIG. 1, the battery control IC 11 shown in FIG. 5 further includes a temperature measurement unit 115 that measures the temperature of a secondary battery cell(s) (i.e., the temperature of the battery pack). Further, the battery control IC 11 shown in FIG. 5 retains an initial-value table in the register 112. In the initial-value table, a plurality of available power values of the battery pack according to the state of a secondary battery cell(s) are recorded. The other configuration of the battery control IC 11 shown in FIG. 5 is similar to that of the battery control IC 11 shown in FIG. 1, and therefore its explanation is omitted.

Figure 6B:
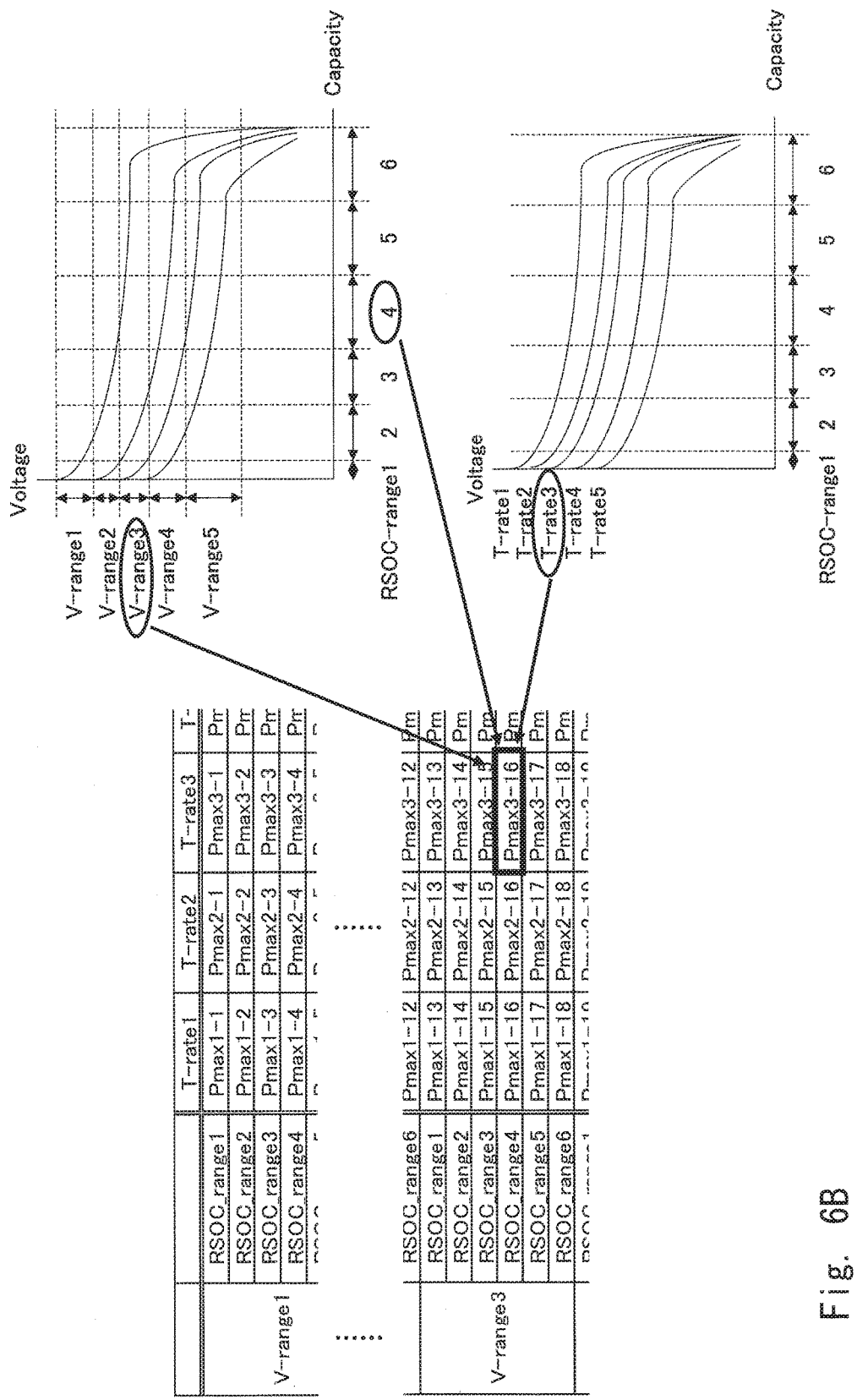
FIG. 6B is a diagram for explaining an initial-value table that is referred to by a battery control IC according to a second embodiment.

FIG. 6A is a conceptual initial-value table that is referred to by the battery control IC according to this embodiment. Further, FIG. 6B is a diagram for explaining that initial-value table.

In the initial-value table shown in FIGS. 6A and 6B, available power values Pmaxs of the battery pack according to the voltage value, the sectional average current value (cumulative current amount), and the temperature of a predetermined secondary battery cell (e.g., a secondary battery cell that has exhibited the lowest voltage value) are recorded. Note that the horizontal axis represents the temperature range of the predetermined secondary battery cell (T-rate1, T-rate2, and so on), and the vertical axis represents the voltage value range of the predetermined secondary battery cell (V-range1, V-range2, and so on) and the cumulative current amount (RSOC_range1, RSOC_range2, and so on).

The battery control IC 11 according to this embodiment extracts an available power value Pmax from the initial-value table like the one shown in FIGS. 6A and 6B according to the voltage value, the cumulative current amount, and the temperature of the measured secondary battery cell, and outputs the extracted available power value Pmax. Note that when any of the voltage value, the cumulative current amount, and the temperature of the predetermined secondary battery cell is outside the initial-value table or is between two neighboring values, the available power value Pmax may be obtained by linear interpolation.

Even in the case where the available power value Pmax cannot be calculated with high accuracy by using a simple calculating formula alone, such as in the case of nonlinear region, the battery control IC 11 according to this embodiment can outputs the available power value Pmax with high accuracy by increasing the accuracy of the initial-value table in advance.

Further, the battery control IC 11 according to this embodiment can extract and output an available power value Pmax from the initial-value table even in a state where the computer system is continuously in the normal current mode without changing to the short-time large-current mode once.

Third Embodiment

When compared with the battery control IC 11 according to the second embodiment, the battery control IC 11 according to the third embodiment further has a function of automatically correcting an available power value(s) Pmax recorded in the initial-value table in accordance with an available power value(s) Pmax (actually measured value(s)) calculated by the calculation unit 116.

Figure 7:
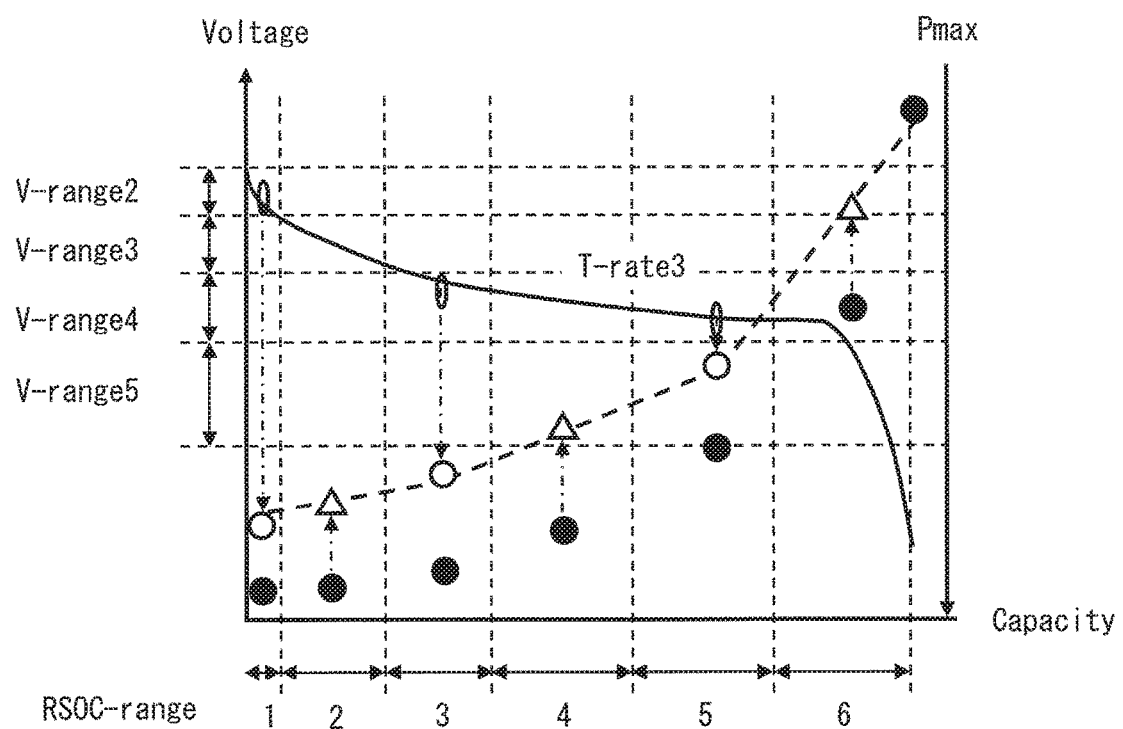
FIG. 7 is a diagram for explaining a correction method for an initial-value table that is referred to by a battery control IC according to a third embodiment.

FIG. 7 is a diagram for explaining a method for correcting an initial-value table. Note that the solid line represents a relation between cumulative current amounts and voltage values in a given temperature range (T-rate3). The black circles in FIG. 7 indicate available power values Pmaxs that are initially recorded in the initial-value table. The white circles in FIG. 7 indicate available power values Pmaxs (actually measured values) that are measured according to the first embodiment or the like. The triangles indicate available power values Pmaxs that are obtained by linear interpolation based on the actually measured values (white circles in FIG. 7).

The battery control IC 11 according to this embodiment rewrites a plurality of available power values Pmaxs (black circles in the figure) recorded in the initial-value table into actually measured values (white circles in the figure) or values (triangles in the figure) obtained by linear interpolation based on actually measured values. As a result, even when the characteristic of the secondary battery cell changes (deteriorates), a difference(s) between values recorded in the initial-value table and actually measured values can be automatically corrected. Therefore, it is possible to continue outputting the available power value Pmax with high accuracy even when the characteristic changes over time.

Fourth Embodiment

Figure 8:
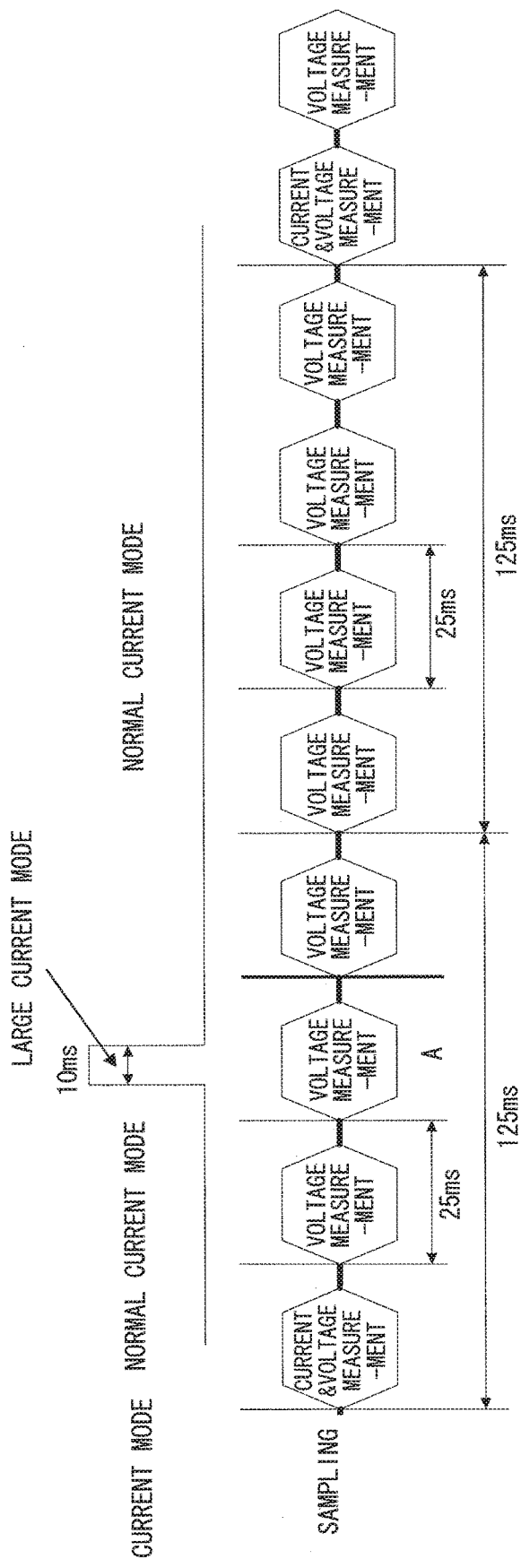
FIG. 8 is a timing chart showing an operation of a battery control IC according to a fourth embodiment.

FIG. 8 is a timing chart showing an operation of a battery control IC according to a fourth embodiment. As shown in FIG. 8, the battery control IC according to this embodiment makes the voltage measurement time and the voltage measurement period of the secondary battery cell(s) longer than the duration of the short-time large-current mode.

By doing so, in a voltage measurement period including the short-time large-current mode, the voltage value of the secondary battery cell to be measured is low. Further, in other voltage measurement periods, the voltage value of the secondary battery cell to be measured is high. By detecting the difference between these voltage values, it is possible to measure the voltage value of a secondary battery cell(s) in the short-time large-current mode.

For example, assume that the duration of the short-time large-current mode is 10 ms and the voltage measurement period is 25 ms. Further, assume that the voltage value of the secondary battery cell has decreased by 10% in the short-time large-current mode. In such a state, a voltage drop of 4% (=10%×10 ms/25 ms) is observed in the voltage measurement period including the short-time large-current mode in comparison to the other voltage measurement periods. To put it differently, when a 4% voltage drop is observed in a given voltage measurement period in comparison to other voltage measurement periods, it means that the voltage value of the secondary battery cell has decreased by 10% in the short-time large-current mode.

In the case of the battery control ICs according to the first to third embodiments, when the voltage in the short-time large-current mode needs to be obtained with high accuracy, it is necessary to make the voltage measurement time and the voltage measurement period sufficiently shorter than the duration of the short-time large-current mode. In such a case, it is necessary to adopt a high-speed and low-noise AD converter(s) or the like for the voltage measurement unit. Further, the power consumption during operation increases. In contrast to this, the battery control IC according to this embodiment makes it possible to measure the voltage value of a secondary battery cell(s) in the short-time large-current mode with practical accuracy and with low power consumption.

Note that the configuration of the battery control IC according to this embodiment is not limited to the configurations of the battery control ICs according to the first to third embodiments. That is, other configurations capable of implementing the operation explained above with this embodiment may be also employed.

[Difference from Related Art]

The configurations disclosed in Japanese Unexamined Patent Application Publications No. 2010-34016, No. 2003-79059 and No. 2001-51029 do not take account of the voltage value measurement in the short-time large-current mode that occurs unexpectedly and continues only for a short period. Therefore, those configurations according to the related art cannot calculate the available power value of the battery pack in the short-time large-current mode in a short time. Further, since those configurations according to the related art require a large-scale measurement apparatus, they cannot be directly applied to a battery control IC that measures the voltage value of a battery pack during operation in real time.

The present invention made by the inventors has been explained above in a specific manner based on embodiments. However, the present invention is not limited to the above-described embodiments, and needless to say, various modifications can be made without departing from the spirit and scope of the present invention.

The first to fourth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A battery pack unit comprising:
   a battery pack comprising a plurality of unit battery cells combined therein; and
   a battery control Integrated Circuit (IC),
   wherein the battery control IC comprising:
   a processor configured to execute:
   a voltage measurement unit configured to measure, in a normal current mode, a voltage value of each of the plurality of unit battery cells forming the battery pack, and measure, in a short-time large-current mode, a voltage value of a unit battery cell, among the plurality of unit battery cells, that has exhibited a lowest voltage value in the normal current mode;
   a calculation unit configured to calculate an available power value of the battery pack in the short-time large-current mode based on a voltage value, measured in the short-time large-current mode, of the unit battery cell that has exhibited the lowest voltage value in the normal current mode; and
   an output unit configured to control an amount of increase in a clock frequency of a circuit using the battery pack in the short-time large-current mode in according with the available power value.

2. The battery pack unit according to claim 1, wherein the voltage measurement unit measures, in the short-time large-current mode, a voltage value of only the unit battery cell that has exhibited the lowest voltage value in the normal current mode among the plurality of unit battery cells.

3. The battery pack unit according to claim 1, wherein the voltage measurement unit comprises a smaller number of voltage measurement circuits each capable of measuring a voltage value of only one unit battery cell at a time than the number of the plurality of unit battery cells.

4. The battery pack unit according to claim 1, wherein the voltage measurement unit comprises a smaller number of AD converter units than the number of the plurality of unit battery cells.

5. The battery pack unit according to claim 1, wherein the calculation unit calculates, in the short-time large-current mode, the available power value of the battery pack based on the voltage value of the unit battery cell that has exhibited the lowest voltage value in the normal current mode and a current value flowing to the battery pack.

6. The battery pack unit according to claim 1, wherein the battery control IC further comprising a storage unit that stores a table, a plurality of available power values of the battery pack according to a voltage value, a cumulative current amount, and a temperature of the unit battery cell being recorded in the table, wherein
   the battery control IC extracts an available power value of the battery pack according to a measured voltage value, a cumulative current amount, and a temperature of a unit battery cell, and outputs the extracted available power value.

7. The battery pack unit according to claim 6, wherein the battery control IC rewrites an available power value of the battery pack recorded in the table into a corresponding available power value of the battery pack calculated by the calculation unit.

8. The battery pack unit according to claim 1, further comprising
a resistive element that is disposed on a current flow path through which a current that flows through the battery pack flows and that measures the current that flows through the battery pack.

9. The battery pack unit according to claim 1, further comprising:
a first diode disposed on a current flow path between the battery pack and an external connection terminal in a forward direction from the battery pack toward the external connection terminal;
a first MOS transistor that is connected in parallel with the first diode and is controlled to be turned on/off with the battery control IC;
a second diode disposed on the current flow path between the battery pack and the external connection terminal in a reverse direction from the battery pack toward the external connection terminal; and
a second MOS transistor connected in parallel with the second diode, the second MOS transistor being configured so that its On/Off state is controlled complementarily to the On/Off state of the first MOS transistor by the battery control IC.

* * * * *